United States Patent [19]

Taylor et al.

[11] 4,377,437

[45] Mar. 22, 1983

[54] DEVICE LITHOGRAPHY BY SELECTIVE ION IMPLANTATION

[75] Inventors: Gary N. Taylor; Thirumalai N. C. Venkatesan, both of Bridgewater, N.J.

[73] Assignee: Bell Telephone Laboratories, Incorporated, Murray Hill, N.J.

[21] Appl. No.: 266,220

[22] Filed: May 22, 1981

[51] Int. Cl.$^3$ .................. B44C 1/22; C03C 15/00; C03C 25/06

[52] U.S. Cl. .................. 156/628; 156/643; 156/646; 156/655; 156/659.1; 204/192 E

[58] Field of Search ............ 156/643, 646, 628, 653, 156/657, 668, 662, 654–655, 659.1; 427/43.1, 38, 85, 40, 41; 430/296, 297, 299, 313, 323, 326, 328; 148/1.5, 187, 179; 204/192 E, 192 N

[56] References Cited

U.S. PATENT DOCUMENTS

| | | | |
|---|---|---|---|
| 3,769,109 | 10/1973 | MacRae et al. | 156/628 |
| 4,062,747 | 12/1977 | Chang et al. | 204/164 |
| 4,108,715 | 8/1978 | Ishikawa et al. | 156/628 |
| 4,132,586 | 1/1979 | Schaible et al. | 156/904 X |
| 4,244,799 | 1/1981 | Fraser et al. | 204/192 E |
| 4,269,935 | 5/1981 | Masters et al. | 430/323 |
| 4,307,178 | 12/1981 | Kaplan et al. | 430/296 |

OTHER PUBLICATIONS

Sacher Technik Wien, Jun. 1979, Ion-Projection-System for IC Production by G. Stengl et al., pp. 1–45.
Polymer Engineering and Science, vol. 20, No. 16, Mid-Nov. 1980, Oxygen Plasma Removal of Thin Polymer Films by G. N. Taylor et al., pp. 1087–1092.
Japanese Journal of Applied Physics, vol. 19, No. 10, Oct. 1980, Dry Development of Resists Exposed to Focused Gallium Ion Beam by Hiroki Kuwano et al., pp. L 615–L 617.
Journal of the Electrochemical Society, Oct. 1979, Rever Etching of Chromium Film in Gas Plasma by Teruhiko Yamazaki et al. pp. 1794–1798.
Japanese Journal of Applied Physics, vol. 19, No. 7, Jul. 1980, The Role of a Photoresist Film on Reverse Gas Plasma Etching of Chromium Films by Teruhiko Yamazaki et al., pp. 1371–1376.
Journal of Vacuum Science Technology, vol. 17(6), Nov./Dec. 1980, Gas Plasma Etching of Ion Implanted Chromium Films by T. Yamazaki et al., pp. 1348–1350.

*Primary Examiner*—William A. Powell
*Attorney, Agent, or Firm*—James H. Fox

[57] ABSTRACT

A method is shown whereby implanted ions, for example indium or gallium ions, are used to selectively define a pattern on a material, typically a polymer. The implanted regions react with a plasma (for example, an oxygen plasma) to form a patterned, nonvolatile protective layer (e.g., indium oxide or gallium oxide) on the material. Subsequent etching, which can typically be accomplished by the same plasma, produces a negative tone pattern. Materials other than polymers can be utilized. For example, an indium implant in $SiO_2$ allows direct pattern generation by exposure to a fluorine plasma, without the use of a separate polymeric resist.

10 Claims, No Drawings

DEVICE LITHOGRAPHY BY SELECTIVE ION IMPLANTATION

BACKGROUND OF THE INVENTION

1. Field of the Invention

This invention relates to a lithography technique for use in the production of solid state devices.

2. Description of the Prior Art

The production of solid state devices, including semiconductor integrated circuits and discrete devices, lightwave devices, Josephson junction devices, magnetic bubble devices, etc., typically requires the generation and replication of fine line patterns during at least some stages of the production process. Higher density circuits and higher performance devices are achieved in part by reducing the size of the geometry of the patterns. Current research is typically concerned with generating patterns having minimum line widths of 2 microns or less and especially with dimensions of 1 micron or less.

Lithographic materials utilized for recording pattern information include organic polymers sensitive to visible light, ultraviolet light, X-ray radiation, or electron beam radiation. Ion beams have also been considered for use in pattern generation. Most present day resists known to be suitable for irradiation by electron beams are also suitable for irradiation by ion beams. For example, poly(methylmethacrylate) (PMMA) is a standard resist utilized in research on submicron geometry devices. When exposed to an electron beam, PMMA and certain other electron beam resists undergo band scission in the irradiated region, rendering the irradiated region more soluble in a developer, producing a positive tone resist pattern. The pattern is then typically transferred to an underlying layer, such as an oxide layer, by etching techniques known in the art. Ion beams can offer even higher resolution than electron beams, due to the higher mass of the accelerated particles and the shorter range of the secondary electrons produced upon impact. Ion beams are generally thought to expose PMMA and other electron beam resists mainly by these secondary electrons. Thus, the chemistry of the resist irradiation process is similar for both electron beam irradiation and ion beam irradiation for most known resists.

One problem of irradiating known electron beam resists with heavy ion beams (i.e., ions of elements having an atomic weight greater than about 20) is that the ion beams typically penetrate only a short distance into the resist material, leaving a large part of the resist substantially unexposed. For example, in a 1 micron layer of PMMA, gallium or indium ion beams accelerated through a potential of 20 kilovolts penetrate only about 250 Angstroms into the resist. Upon wet development, the regions underlying the exposed layer are not fully developed, leaving only a shallow relief image in the exposed regions. While higher energy ion beams can be used to overcome this problem, such beams are currently difficult to implement in scanning ion beam systems.

Therefore, it is desirable to obtain resist materials that can be exposed with relatively low energy ion beams while achieving fine line pattern generation. In other areas of concern, it is desirable in some cases to eliminate polymeric resist materials entirely and to form a pattern directly on a device layer; for example, a silicon dioxide layer or a metal layer.

SUMMARY OF THE INVENTION

We have invented a lithographic process whereby ions are selectively implanted in a material and subsequently exposed to a reactive atmosphere. The implanted species react with the reactive atmosphere to form a nonvolatile protective compound in the implanted regions of the material, so that such protected regions are etched at a slower rate than unprotected regions when the material is exposed to a plasma. Typically, the reactive atmosphere used to form the protective compound is also the plasma used for etching. A negative tone pattern is thereby produced in the material. The material so patterned by this lithography process can be an organic polymer material. The lithographic process can also be applied to an inorganic layer directly, for example an $SiO_2$ layer or a metal layer.

DETAILED DESCRIPTION

The following detailed description relates to a lithography process whereby ions are selectively implanted into a material and subsequently treated to form a negative tone pattern in the material. The ion species employed in this invention are typically ions of metals or semimetals, including semiconducting elements. Practicing the present invention by implanting surface layers as discussed below allows an accelerating potential of less than 20 kilovolts to be used in many cases, although higher energy ion beams are also possible, and are included herein. The ionic species, typically implanted to a mean depth less than 50 percent of the thickness of the material being implanted, is subsequently treated with a reactive atmosphere, typically an oxygen or halogen-containing plasma, to form a protective compound in the implanted regions of the material. The protective compound thus comprises at least one implanted species, and at least one species derived from the reactive atmosphere. For example, implanting gallium ions followed by treatment in an oxygen plasma forms $Ga_2O_3$ protective material. The material is then etched in a plasma so that the unprotected regions are removed at a faster rate than the protected regions, yielding a negative tone pattern. To distinguish cases wherein inadvertent difference in etch rates occurs by the prior art etching of ion-implanted materials, we limit the present process to cases wherein the etch rate of the unimplanted (unprotected) portions of the material is at least 1.3 times the etch rate of implanted (protected) regions of the material. The ratio of these etch rates is hereinafter referred to as the "etch rate ratio". In many cases, the etch rate ratio exceeds 5. Another parameter of significance is the normalized thickness of the developed pattern, referred to herein as $NT_d$. This value is computed by dividing the thickness of the relief pattern in the implanted regions of the material after plasma etching by the initial thickness of the material. When practicing the present invention, this value is typically greater than 0.1.

The ion implantation may be by any method providing selective ion implantation including, for example, scanning focused ion beams, including raster and vector scan methods, or projection beam techniques wherein a shadow mask is utilized between an ion source and the material being selectively implanted. The implanted material can be an organic polymer or inorganic material. The material can be deposited on a solid state device precursor to serve as a mask for etching of the precursor, or for other purposes, as are known in the art. The inventive technique can also be used to generate a pattern on a shadow mask, that is separate from a device precursor, for use with any suitable actinic radiation for transferring the pattern to a device precursor. To obtain improved resolution in the material, it is desirable in many cases, especially with higher implant doses, to provide for charge removal from the material. Otherwise, excess charge buildup in the material can limit resolution. For this purpose, a polymer material is desirably of relatively low resistivity, typically less than $10^8$ ohm-cm and preferably less than $10^6$ ohm-cm. This can result from the intrinsic low resistivity of the polymer. Also, the resistivity of typical polymers can be reduced by various techniques known in the art. For example, exposing a polymer to a nitrogen plasma and subsequently exposing it to a humid atmosphere, which serves to trap water on the surface, typically reduces the surface resistivity of polymer materials. Positive charge buildup can also be prevented by providing a cloud of electrons adjacent to the implanted material, or by providing a grounded low resistivity inorganic or organic layer on the surface of the implanted material.

The reactive atmosphere used for forming the protective compound typically also serves to subsequently etch the implanted material. For example, an oxygen plasma can be utilized with an implant of indium ions to form indium oxide as the protective compound in a surface layer of a polymer material. Allowing the polymer material to remain in the oxygen plasma can produce etching of the polymer material. However, a different reactive atmosphere can be used to form the protective compound. For example, atomic oxygen can be used as the reactive atmosphere to form a protective oxide, or atomic fluorine can be used to form a protective fluoride. A plasma can then be used for etching. The term "plasma" as used herein refers to an atmosphere having at least one ionized species. The plasma can be produced in a variety of ways, but preferably is produced in such a way as to impart a degree of anisotropy to the etching of the implanted material. A suitable plasma is produced in a reactive ion etching (RIE) apparatus. Plasmas are also produced in reactive sputter etching apparatus, reactive ion beam etching apparatus, and others known in the art. For example, the method and apparatus disclosed in U.S. Pat. No. 4,062,747, coassigned with the present invention, can be used. In that technique, electrons are directed at a substrate in the presence of oxygen to produce the plasma, which can also serve as the aforesaid reactive atmosphere.

The ionic species can be a charged elemental species, typically positively charged, but it can also be a charged molecular species. For obtaining implants at relatively shallow depths in most polymer materials, an ion beam accelerating potential of typically 100 kilovolts or less is utilized, typically resulting in an implant depth of less than 1000 Angstroms. Higher accelerating potentials can also be utilized, although the resulting mean depth of the implant will be increased to substantially beyond a surface layer in many cases. However, such beams can also be utilized. For example, a high energy beam that results in depositing the ions at a given depth in the implanted material will result in relatively rapid etching of the material until the implant layer is reached. The plasma then reacts with the implant layer to form the protective layer, reducing the etch rate in the implanted regions. Such a technique might be desirable, for example, to overcome the effects of surface contamination. It also allows the use of high energy beams, which can in some cases be better focused than lower energy beams, or may be desired for other reasons. An ion beam having a relatively wide spread of kinetic energy of the ionic species will result in a relatively broad implant distribution. This can also be utilized in many cases.

The above principles and procedures will be more fully illustrated by means of the following Examples.

EXAMPLE 1

Indium ions from a liquid indium source were accelerated through a potential of 3 kilovolts and directed towards a complex polymer material consisting of two parts poly(vinylcarbazole) and one part trinitrofluorinone by weight. The polymer material was 1.6 microns thick. The implant flux was $10^{13}$ ions/cm$^2$/second. A 100 second implant time ($10^{15}$ ions/cm$^2$ dose) was followed by etching in an oxygen plasma for 19 minutes. The oxygen plasma was produced in a Cook Vacuum Products Model SPS-.5K-AA reactive ion etcher at 25 mtorr pressure and 100 watts power level. This resulted in a final thickness of about 1800 Angstroms in the regions of the polymer protected by the implanted ions after the unimplanted regions had etched through the thickness of the resist down to the substrate. A sharp edge profile of approximately 1 micron dimension was obtained; $NT_d=0.11$. When the above experiment was performed at a $2 \times 10^{15}$ ion/cm$^2$ dose and etched as above, 6400 Angstroms final thickness was obtained in the implanted regions upon completion of etching down to the substrate in the unimplanted regions. The etch rate ratio of the unimplanted to the implanted regions was 1.67; $NT_d=0.4$. It is estimated that in this Example, the mean depth of the ion implant was approximately 50 Angstroms from the surface of the polymer.

EXAMPLE 2

The same polymer as in Example 1 was implanted with 20 kilovolt indium ions that were focused to a spot diameter of 2500 Angstroms. A series of spots were overlapped just sufficiently to touch one another, and were formed into chevron patterns 40 microns long and 0.3 microns wide. The thickness of the polymer material was 1.6 microns, and ion implant doses of from $1 \times 10^{14}$ to $10^{17}$ ions/cm$^2$ were utilized. Plasma development in a reactive ion etcher as in Example 1 was employed. Unbroken chevron patterns were observed at a dose of $2 \times 10^{16}$ ions/cm$^2$, which produced a final resist thickness in the implanted region of 11,000 Angstroms. The etch rate ratio was 32; $NT_d=0.69$. At the above implant energy, it is estimated that the ions were implanted at a mean depth of approximately 250 Angstroms below the surface of the polymer material, with a spread in depth of about 30 Angstroms.

EXAMPLE 3

The implanted material in this Example was a 1 micron thick film of poly(vinylformal) having a 100 Angstrom thick layer of carbon sputtered on the surface in order to reduce resistivity for the purpose of enhancing charge removal. This material was implanted with indium ions accelerated through a potential of 20 kilovolts and having a beam diameter of 2500 Angstroms. Exposure doses of from $10^{14}$ to $10^{17}$ ions/cm$^2$ were used. At a dose of $10^{16}$ ions/cm$^2$, a final thickness of 6,000 Angstroms in the implanted regions was obtained upon etching in an oxygen plasma reactive ion etching atmosphere, as above; $NT_d=0.6$. Line widths of approximately 5,000 Angstroms were obtained, with this resolution being limited by vibration of the apparatus during exposure.

Other polymer materials that give good results include poly(vinyl chloride), poly(styrene), PMMA, and poly(vinylbenzyltrimethyl ammonium chloride) at an indium ion beam irradiation dose of typically about $5 \times 10^{15}$ ions/cm$^2$, and etched as above. A suitable polymer material should typically etch in the plasma at a rate of at least several hundred Angstroms per minute; the above polymers typically etch at least 500 Angstroms/minute under the conditions of Example 1 in the unimplanted regions. Furthermore, to maintain pattern geometry, a suitable polymer should not appreciably flow during the irradiating or subsequent processing steps; we recommend polymers having a glass transition temperature ($T_g$) of typically at least 50 degrees Celsius, and preferably at least 100 degrees Celsius.

In addition to the use of indium ion implants, numerous other ionic species can be utilized. For example, gallium has a relatively low melting point and a high boiling point and hence can conveniently serve as the source of low energy ions using a liquid metal ion source. Gallium forms gallium oxide in an oxygen plasma atmosphere, which protects the above materials. Any molecular species that forms a relatively nonvolatile compound in the reactive atmosphere as compared to the volatility of the unimplanted regions of the material in a given plasma etchant can be utilized in practicing the present invention. The volatility of numerous compounds can readily be determined from their boiling points as shown, for example, in "Physical Constants of Inorganic Compounds", in the *Handbook of Chemistry and Physics*, 51st Edition, published by the Chemical Rubber Company, at pages B63–B156. We recommend choosing the implanted ion/reactive atmosphere combination to produce a protective compound having a boiling point of at least 300 degrees C., and preferably at least 500 degrees C., when implanting typical organic polymer materials. Even higher values are more desirable for implanting inorganic materials. For typical polymer materials, suitable ionic species produced by liquid metal ion sources include gallium, indium, and gold. These elements form stable, nonvolatile oxides in an oxygen plasma, with an oxygen plasma typically also being suitable as the etchant for removing the unimplanted polymer material. These elements also form relatively stable, nonvolatile fluorides in a fluorine plasma, with a fluorine plasma also being suitable for etching certain inorganic materials. Other halogen-containing plasmas are also possible for use with various inorganic materials, according to considerations known in the etching art.

As noted above, the ion implant technique can also be used to define features directly on an inorganic layer of a precursor device, for example SiO$_2$ or Si$_3$N$_4$ layer, without the use of a polymer resist. For example, indium can be implanted into SiO$_2$ and exposed to a reactive atmosphere comprising fluorine to produce the protective compound indium fluoride (InF$_3$). A suitable halogen-containing plasma, which can typically be the same reactive atmosphere used to form the indium fluoride, subsequently etches the unprotected regions to produce a patterned layer of SiO$_2$, which may be, for example, on a substrate of silicon or other material.

In many cases, it is desirable to practice the present invention with a multilevel resist scheme, whereby a planarizing layer, typically of polymer material, is first applied to a substrate having relief features therein. An additional layer, typically silicon dioxide or metal or another inorganic, relatively etch-resistant material, is then applied on top of the polymer layer. The lithography is then performed on the top inorganic layer and subsequently transferred into the polymer layer by plasma etching. It is also desirable to be able to form a pattern on SiO$_2$ directly for other purposes. One example of this technique using the present lithographic process on SiO$_2$ is shown in the next Example.

EXAMPLE 4

A 2.6 kilovolt ion beam was used to implant indium into a layer of SiO$_2$, 1200 Angstroms thick, on top of a silicon wafer, at a dose of $8 \times 10^{15}$ ions/cm$^2$. The wafer was developed in a CF$_4$ plasma at a pressure of 8 mtorr in a reactive ion etcher for 12 minutes. The final thickness was 1000 Angstroms in the implanted regions; the etch rate ratio was 6; $NT_d=0.83$. In a second experiment, a dose of $1 \times 10^{16}$ ions/cm$^2$ was used; the final thickness was 1200 Angstroms in the implanted region after etching, so that the etch rate ratio was very large, greater than 100; $NT_d=1.0$. These experiments were repeated with CHF$_3$ as the etching atmosphere at a pressure of 5 mtorr, resulting in an etch time of 6 minutes, with comparable final thickness in the implanted regions as before.

To accomplish the above-noted two-layer resist scheme, the SiO$_2$ can be deposited on top of a polymer, such as poly(vinylformal), PMMA, etc. After developing the SiO$_2$ layer in a halogen-containing plasma, the pattern can be transferred into the polymer layer by etching in an oxygen plasma.

While certain suitable ionic species and implanted materials and etching media have been illustrated by the above Examples, numerous other combinations are possible. One advantage of the present implant lithographic technique is that an implanted polymer material need not be substantially homogenous through the thickness of the polymer material, as is typically required for other resist materials. This is because an etch-resistant surface layer formed by the present technique substantially protects all underlying regions of the polymer material in the presence of a substantially anisotropic etch, such as is obtained by reactive ion etching or other techniques, so that composition differences in the polymer material have relatively little influence on the final negative resist pattern produced. Advantage of this fact can be taken by applying polymer materials conformally to substrates having surface features thereon by deposition techniques that include, for example, chemical and plasma vapor deposition, etc., that typically result in a certain degree of variation in the composition of the deposited polymer as a function of depth. Additionally, a top layer of the polymer material can be carbonized by various techniques to provide for reduced resistivity of the polymer for charge disposition purposes, as noted above. All such uses of the inventive technique utilizing the teachings through which the present invention has advanced the art are considered to be within the spirit and scope of the present invention.

What is claimed is:

1. A method of making an article including at least one pattern delineation step CHARACTERIZED by selectively implanting an ionic species into a material and exposing the material to a reactive atmosphere, whereby the implanted species forms a nonvolatile protective compound in implanted regions of said material, with said protective compound comprising at least one implanted species and at least one species derived from the reactive atmosphere, so that the regions of said material so protected are etched at a slower rate than unprotected regions when said material is exposed to a plasma, and etching said material in a plasma, thereby producing a negative tone pattern.

2. The method of claim 1 wherein said reactive atmosphere that is used to form said nonvolatile protective compound in said material is said plasma that is used to etch said material.

3. The method of claim 2 wherein said plasma comprises oxygen, and said protective compound is an oxide of said implanted species.

4. The method of claim 2 wherein said plasma comprises fluorine, and said protective compound is a fluoride of said implanted species.

5. The method of claim 1 wherein said ionic species is selected from the group consisting of indium, gallium, and gold.

6. The method of claim 1 wherein said material is an organic polymer.

7. The method of claim 1 wherein said material is silicon dioxide.

8. The method of claim 1 wherein said implanted species substantially resides in a surface layer of said material that is less than 50 percent of the initial thickness of said material.

9. The method of claim 1 wherein said material is a polymer that is conformally applied to a substrate by chemical vapor deposition or plasma vapor deposition onto said substrate.

10. The method of claim 1 wherein said material is an inorganic layer, with said inorganic layer being located on an organic polymer layer, whereby a plasma further etches the pattern formed in said inorganic layer through said polymer layer.

* * * * *